United States Patent [19]
Sharma et al.

[11] Patent Number: 5,980,998
[45] Date of Patent: Nov. 9, 1999

[54] DEPOSITION OF SUBSTANCES ON A SURFACE

[75] Inventors: Sunity Sharma, Fremont; Durga Annavajjula, Mountain View, both of Calif.; Kuldip Bhasin, Chandigar, India; Subhash Narang, Palo Alto; Asutosh Nigam, Fremont, both of Calif.

[73] Assignee: SRI International, Menlo Park, Calif.

[21] Appl. No.: 09/042,182

[22] Filed: Mar. 12, 1998

Related U.S. Application Data

[60] Provisional application No. 60/060,711, Sep. 16, 1997.
[51] Int. Cl.$^6$ .............................. B32B 3/00; B32B 7/00; B32B 15/00
[52] U.S. Cl. .............................. 427/559; 427/96; 427/98; 427/282; 427/421; 427/256; 427/258; 427/261; 427/558; 430/313; 430/315; 430/324; 430/329
[58] Field of Search .............................. 427/96, 98, 304, 427/305, 556, 581, 597, 282, 421; 430/313, 315, 324, 329; 428/209, 901

[56] References Cited

U.S. PATENT DOCUMENTS

| | | | |
|---|---|---|---|
| 3,994,727 | 11/1976 | Polichette et al. | 96/38.4 |
| 4,614,837 | 9/1986 | Kane et al. | 174/685 |
| 4,808,274 | 2/1989 | Nguyen | 204/15 |
| 5,041,420 | 8/1991 | Nagesh et al. | 505/1 |
| 5,281,447 | 1/1994 | Brady et al. | 427/555 |
| 5,378,508 | 1/1995 | Castro et al. | 427/556 |
| 5,468,597 | 11/1995 | Calabrese et al. | 430/305 |
| 5,534,312 | 7/1996 | Hill et al. | 427/533 |
| 5,576,074 | 11/1996 | Weigel et al. | 427/559 |

*Primary Examiner*—Michael Lusignan
*Attorney, Agent, or Firm*—Robert D. Fish; Crockett & Fish

[57] ABSTRACT

Methods and apparatus are provided in which a coating is deposited onto a substrate by a process which includes the following steps: depositing a precursor onto the substrate in a desired pattern; depositing an appropriate ligand onto the substrate; and applying sufficient energy to transfer electrons from the ligand to the precursor, thereby decomposing the precursor to form a precipitate. In one aspect of preferred embodiments, the precursor comprises a metallic salt, and the precipitate comprises a metal. Especially preferred salts are carboxylates, halides, nitrates, and pseudo halides. In another aspect of preferred embodiments, the ligand comprises an amine, an amide, a phosphine, a sulfide, or any other ligand containing nitrogen, phosphorous, sulphur or other donor atoms. In another aspect of preferred embodiments, the energy is supplied at least partially as radiant heat. In another aspect of the preferred embodiments, the deposited material has a high purity of at least 80% by weight, a desired pattern is produced without removing from the substrate a substantial quantity of either the precursor or the deposited coating.

28 Claims, 3 Drawing Sheets

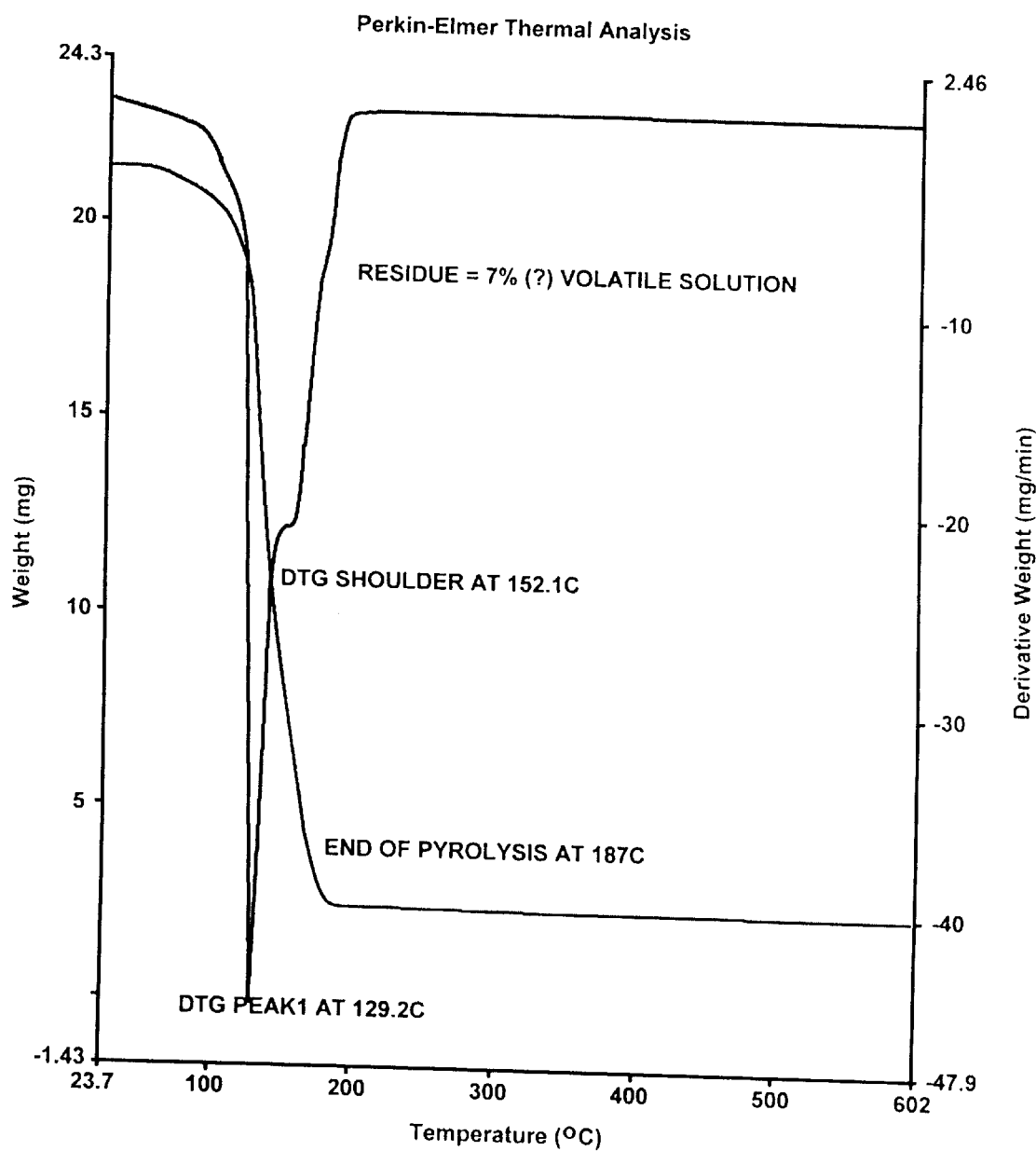

DEPOSITION OF SUBSTANCES ON A SURFACE

This application claims priority to provisional application 60/060,711 filed Sep. 16, 1997.

REFERENCE TO GOVERNMENT GRANT

This invention was made with Government support. The Government has certain rights in the invention.

FIELD OF THE INVENTION

The field of the invention is surface deposition of substances onto substrates.

BACKGROUND

There are many applications which involve the deposition of a substance onto a substrate. Commercially important methods include common printing techniques such as lithography, photocopying, spray depositing, and silk screening. These methods are quite adequate for depositing toners, dyes and other colorants which are readily fluidized, but are quite inadequate for depositing other materials such as metals, catalysts and so forth where the fluid form of the compound being deposited exists only under high temperature or other difficult working conditions.

Deposition of metals onto substrates is also known, but all known techniques are either imprecise, or are difficult to execute. For example, on the extremely simple end of the scale it is known to employ hot-dipping to apply zinc to nails, beams and other metal structures to retard oxidation of the substrate. It is also known to apply a metal containing paint to a canvas, glass or other substrate. Other simple procedures involve spraying and powder coating, but in all of these instances the techniques are generally imprecise, both in the area covered and in thickness of the coating applied. The coating also generally contains undesired impurities, and is very likely to have an uneven or roughened surface. There are more sophisticated techniques such as vapor deposition which can produce very precise layering of compounds on a substrate, but such techniques cannot produce complex patterns such as circuits.

Focusing then on techniques which are capable of depositing complex and precise patterns of difficult-to-fluidize compounds such as metals, the field can be divided into electro-plating and electroless plating methods. In electroplating an entire surface of a substrate is coated with a metal, and portions of the coating are then selectively removed by etching or other approaches. Such processes are cumbersome at best, and have little or no advantage over electroless plating methods when producing complex and precise patterns such as those found in circuit boards or decorations, particularly where the substrate is non-conducting.

Electroless plating occurs through chemical rather than electrical reactions. Electroless plating can be divided into immersion systems and non-immersion systems. In immersion systems, the substrate to be coated is generally immersed in a bath of a metal or other coating solution. In the case of metal containing solutions, the metal is then precipitated out of solution and deposited on the substrate by the introduction of energy. Depending on the metal being deposited, the energy acts either to add electrons to the metal ions to form the metal. The energy for such processes is often in the form of a laser, with the wavelength selected to be absorbed by one or more of the molecules involved in the reaction, or with a dye. Unfortunately, there are several problems inherent in immersion processes. One very significant problem is the overall complexity. Immersion systems require some sort of immersion tank, with accompanying relatively large quantities of often toxic fluids. Another problem is that intricate and precise patterns are inherently difficult to achieve due to dispersion of energy within the immersion liquid. Still another problem is that good quality coatings are often unobtainable due to nonuniformity in concentrations and temperatures within the bath. Circulation pumps have been employed to minimize this problem, but such pumps add even greater complexity.

Non-immersion coating techniques overcome some of the problems associated with immersion methods of coating, but only at the cost of introducing yet other problems. In typical non-immersion coating systems, a non-conducting substrate such as glass, glass fibers, paper or plastic is entirely coated with a coating substance. In the case of printed circuit boards, for example, the coating substance which forms the electrically conducting paths is usually a highly conductive metal such as copper, silver or gold. Once coating is completed, the coated surface is masked in some way with a resist, and the masked surface is etched to form the final pattern. The various resists can be made in numerous ways, including photographic processes, silk screening processes and even hand painting.

All such processes known to the art are subtractive processes. Essentially the entire surface is coated with a substance, and then most of the substance is removed to leave a desired pattern. Such processes are inherently cumbersome, difficult and wasteful. Even with expensive equipment and experienced production staff, the quality of the finished product is difficult to control, and there is considerable waste in both the masking agent (resist) and the non-used coating.

So called additive methods of coating are known, but these methods are only partially additive—they are still partially subtractive in that a substantial portion (at least 5% by weight) of either the coating substance or a precursor to the coating substance must be removed to form the final pattern. U.S. Pat. No. 4,614,837 to Kane et al. (September, 1986), for example, describes a partially subtractive method in which a finely divided metal powder is placed on a substrate, and then compacted using a heated die. Under sufficient temperature and pressure, and particularly if the substrate is heat deformable, the method is said to produce usable electrically conductive pathways. Unfortunately, while the Kane et al. method manages to eliminate the need for masking, it raises additional problems. One disadvantage is that the process requires finely ground metal powders. Such powders are expensive, difficult to produce uniformly, and likely to be oxidized during storage. Further, dust and other impurities may also affect the quality of the metal powders, which may in turn cause problems during compaction. Dust collection systems may also be required to safeguard the health of the operatives. Still further, expensive dies having the pattern of the desired circuit also need to be manufactured. Finally, equipment to compress the metal powder onto the board has to be provided.

U.S. Pat. No. 5,576,074 to Weigel et al. (November, 1996) describes another partially subtractive method. In that patent a solution is provided which contains a salt or other metal containing compound, along with an amine developer. The solution is homogenized, and a uniform coating of the homogenized solution is placed on a surface of a substrate. Laser radiation is then trained on the solution according to a desired pattern which reduces the compound to a metal.

The Weigel process continues the prior art concept of indiscriminately coating a surface with a substance, and then using a laser to cause a metal to precipitate out of solution in a desired pattern. Such processes are impractical from several perspectives. The use of a laser energy, for example, results in a relatively slow rate of production because only a small spot can be exposed at any given time, and a certain amount of energy is required to energize the necessary redox reaction(s). Low power lasers will thus take a very long time to produce a pattern of much complexity, while high power lasers may damage the substrate, and may cause other quality problems. For this reason, processes such as the Weigel process may be adequate for preparing one of a kind prototypes, but are inherently impractical for mass production. Still further, lasers having the necessary power are relatively cumbersome and dangerous to use.

Moving beyond the problems inherent in using lasers to effect precipitation, there may also be difficulties in controlling the quality of the finished product because the redox reaction rate is likely to be dependent upon numerous factors, including thickness of the chemical mixture layer on the substrate, the rate of heat absorption into the substrate, and the energy required to excite the molecules of the chemical mixture. Still further, residual amounts of radiation absorbing dye and metallic toner are very likely to vitiate the quality of the finished product. Even if processes such as the Weigel process were perfected, it is thought that such processes are inherently incapable of resolving certain problems such as producing electrically conductive vias. Such processes are also incapable of being used in conjunction with ordinary printing techniques, such as stamping and ink jet type spraying.

U.S. Pat. No. 5,378,508 to Castro (January, 1993) discloses yet another example of partially subtractive deposition in which a surface is coated with a substance, a laser beam is trained on the substance to cause a metal or other product to adhere to the substrate, and then the excess coating substance is washed away to produce the desired pattern. Once again the same disadvantages apply, resulting primarily from the fact that coating material is first added to, and then partially removed from the substrate.

Thus, there is a need to provide coating techniques and apparatus which are capable of depositing a metal or other substance in a precise pattern on a substrate, without requiring substantial removal of either a precursor or the deposited substance from the substrate.

SUMMARY OF THE INVENTION

The present invention provides methods and apparatus in which a coating is deposited onto a substrate by a process which includes the following steps: depositing a precursor onto the substrate in a desired pattern; depositing an appropriate ligand onto the substrate; and applying sufficient energy to transfer electrons from the ligand to the precursor, thereby decomposing the precursor to form a precipitate.

In one aspect of preferred embodiments, the precursor comprises a metallic salt, and the precipitate comprises a metal. Especially preferred salts are carboxylates, halides, nitrates, and pseudo halides. In another aspect of preferred embodiments, the ligand may comprise an amine, an amide, a phosphine, a sulfide, an ester, or indeed any other ligand containing nitrogen, phosphorous, sulphur or other donor atom(s) capable of dissolving and/or engaging the salt in a redox reaction. In another aspect of preferred embodiments, the energy is supplied at least partially as radiant heat. In another aspect of the preferred embodiments, the deposited material has a high purity of at least 80% by weight, and a desired pattern is produced without removing from the substrate a substantial quantity of either the precursor or the deposited coating.

Various objects, features, aspects and advantages of the present teachings will become more apparent from the following detailed description of preferred embodiments, along with the accompanying drawing.

BRIEF DESCRIPTION OF THE DRAWING

FIG. 3 is a thermogram of metallic copper deposited according to one embodiment of the present teachings.

DETAILED DESCRIPTION

Figure 1:
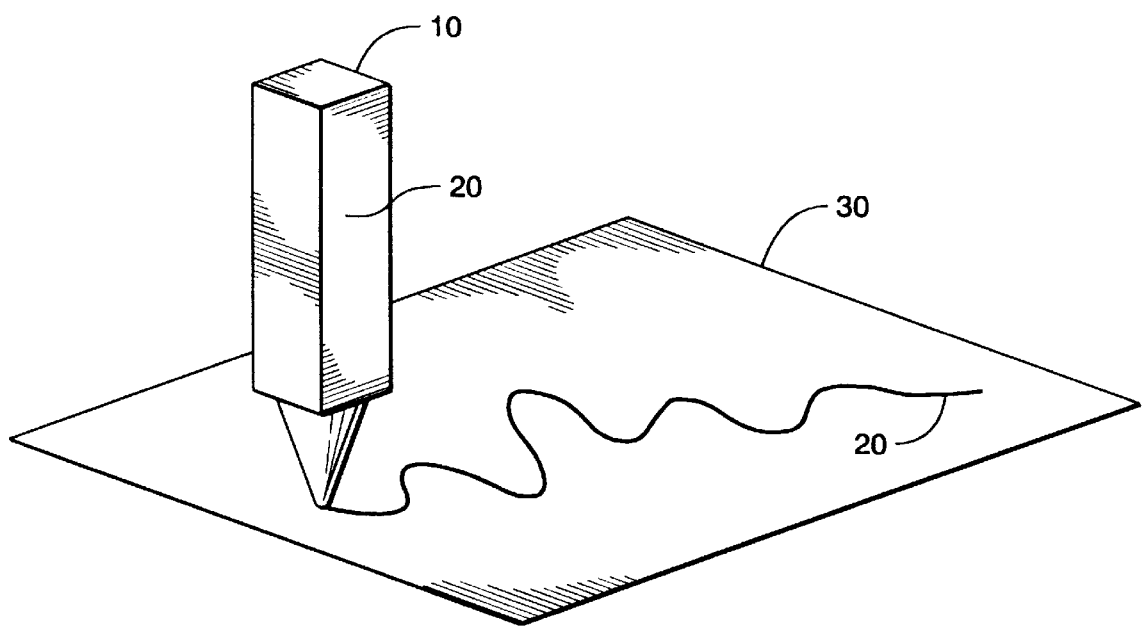
FIG. 1 is a schematic showing deposition of a surface material onto a substrate according to the present teachings.

In FIG. 1 a dispenser 10 containing a solution 20 is used to deposit a substance onto a substrate 30. As described below, there are many possible variations to each of these components.

Dispenser 10 is contemplated to be any device which is capable of forming a desired pattern by dispensing a solution onto a substrate through relative movement between the substrate and at least some portion of the dispenser. Conceptually, dispenser 10 can include two parts, a reservoir for holding the solution, and an applicator. In one class of preferred embodiments, for example, dispenser 10 can be a "point" dispenser such as an ink jet type printer cartridge, a capillary nib, a roller dispenser, a sprayer, or even the end of a compacted mass similar to a pencil lead. In such embodiments the reservoir is basically a holding tank for the dispensed fluid, while the applicator is some form of drawing head. Depending on the specific embodiment, such devices can dispense substance anywhere from an accuracy of tens of Angstroms or less, to a millimeter or more.

It is not necessary for the reservoir to be fluidly or even mechanically coupled to the applicator. For example, the applicator may comprise a rubber or lithograph type stamp, and the reservoir may comprise a stamp pad. In such embodiments there need not be any relative movement at all between the substrate and the reservoir, and instead a relative movement between the applicator and the substrate can be used to form the desired pattern. In still other embodiments the applicator need not translate bodily relative to the substrate, but may tilt or rotate to produce the desired pattern. In still other embodiments, both the reservoir and the applicator may be immobile relative to the substrate, and the fluid dispensed through the applicator may be directed by pneumatic, magnetic or other forces to form the desired pattern.

The term "fluid" is used herein in a broad sense to include any material which flows at the temperatures and pressures employed. Correspondingly, the term "solution" as used herein includes solvents which are liquids, gases or solids. Thus, while the fluid contained by a reservoir may typically be disposed as a liquid, it is also contemplated that the fluid may comprise a gas, or a powdered solid.

Thus, it is contemplated that virtually any type of dispenser may be employed in the present subject matter, as long as the dispenser dispenses a pattern onto the substrate, as opposed to indiscriminately dispensing a broad layer. This broad definition includes, for example, all common methods of printing, including the use of ink jet cartridge type dispensers, thread dispensers, and sprayers, stamping, roller printing, letter press printing, gravure printing, screen printing, flexographic printing, planographic printing, offset printing, mimeo graphic printing, and the like. In fact, any printing process that uses inks can be employed effectively with embodiments of the present teachings.

On the other hand, the definition of the term "dispenser" excludes immersion baths or other techniques in which the entire relevant surface of a substrate is coated indiscriminately. It should also be understood that the terms "onto a surface of the substrate" and "onto the substrate" refer to deposition which is at least significantly disposed on an outer boundary of the substrate. For adsorbent or porous substrates, for example, these and related terms include both depositions in which all of the material being deposited remains on the apparent surface of the substrate, and also depositions in which some of the material being deposited is drawn into the substrate.

The patterns contemplated to be dispensed using apparatus and methods described herein include any arrangement of points or dots, whether isolated or combined to form lines, filled in spaces and so forth. Thus, contemplated patterns include straight and curved lines, intersections of lines, lines with widened or narrowed areas, ribbons, overlapping lines. It is especially contemplated that useful patterns will include circuit board designs, both single and multi-layered designs. With respect to circuit boards, one very significant aspect is that embodiments according to the present subject matter can be adapted to deposit a conductive composition (usually metal) in the "vias" or through holes of a circuit board, thereby assisting in the production of multilayered boards. Such vias may be produced in many different ways, of which drilling is especially preferred.

Other contemplated patterns include layers. For example, it is contemplated that a process of deposition described herein can be repeated to obtain depositions having thicker or multiple layers. Such process can employ repeated or thicker coatings of the same metal or other substance, and alternating layers by using alternating or dissimilar substances.

Solution 20 is generally contemplated herein to include a solvent and solute. The solvent can be any material capable of solvating the solute, but is generally contemplated to comprise an inexpensive, readily available, relatively non-toxic material such as water, various alcohols and so forth. The solute is generally contemplated to include at least two components which chemically react with one another under the influence of an energy source, such that a metal or other substance precipitates out of the solution. In preferred embodiments one component of the solute comprises a salt, while another component of the solute comprises an appropriate ligand. As used herein the term "salt" means any combination of an acid (A) and a base (B). Examples are metallic salts such as copper formate, acetate, acrylate, thiocyanate, and iodide. Other examples are non-metallic salts such as ammonium formate and ammonium acrylate.

The various components of the solution may be deposited on the substrate concurrently or sequentially, or in some combination of the two. Thus, it is contemplated that the salt may be deposited concurrently with the ligand, or separately from the ligand. It is also contemplated that the solvent may itself comprise or contribute one or more aspects of the salt or the ligand.

As used herein the term "ligand" (L) refers to any substance which can be thermally activated to displace one or more aspects of the salt in a redox reaction, such that AB+L→AL+B, or AB+L→A+BL. In processes contemplated herein preferred ligands are non-crystalline, leave no non-metallic residue, and are stable under normal ambient conditions. More preferred ligands are also capable of taking part in redox reactions with a particular salt being used at reasonable temperatures, which are generally considered to be less than about 300° C.

A preferred class of ligands are nitrogen donors, including especially cyclohexylamine. A number of other nitrogen donors and their mixtures, however, may also be used. Examples are 3-picoline, lutidines, quinoline and isoquinoline, cyclopentylamine, cyclohexylamine, cycloheptylamine, cyclooctyl amine, and so forth. These are only a few examples, however, and many other aliphatic primary, secondary and tertiary amines and/or aromatic nitrogen donors may also be used.

Contemplated solutions may include other compounds besides salts and ligands. For example, a mixture of copper (II) formate in a nitrogen donor solvent with or without water and an alcohol may be used to facilitate dispensing in an ink-jet type printer. A small amount of a solvent based polymer or a surfactant may also be useful additives for adjusting the rheology of the precursor solution for ink-jet printing, and to impart better film forming properties. On the other hand, larger amounts of high boiling solvents and/or additives such as triethylphosphate, Triton X100, glycerol, etc., are preferably be avoided as these have a tendency to contaminate the film produced on account of incomplete pyrolysis over temperature sensitive substrates such as Kapton™ or paper. Still further, it may be worthwhile to treat the substrate with a coupling agent to improve the adhesion of the deposited material to the substrate as a function of the coupling agent's modifying the hydrophobicity or hydrophilicity of the surface of the substrate.

Where the salt contains a metal, all metals are contemplated. Preferred metals include conductive elements such as copper, silver and gold, but also include semiconductors such as silicon and germanium. For some purposes, especially production of catalysts, it is contemplated that metals such as cadmium, chromium, cobalt, iron, lead, manganese, nickel, platinum, palladium, rhodium, silver, tin, titanium, zinc, etc. can be used. As used herein, the term "metal" also includes alloys, metal/metal composites, metal ceramic composites, metal polymer composites, as well as other metal composites.

Substrate 30 can comprise virtually any substance upon which a compound can be deposited. For example, contemplated substrates include metals and non-metals, conductors and non-conductors, flexible and inflexible materials, absorbent and non-absorbent materials, flat and curved materials, textured and non-textured materials, solid and hollow materials, and both large and small objects. Particularly preferred substrates are circuit boards, paper, glass, and metal objects. Viewed from another perspective, the wide breadth of contemplated substrates gives some indication of the scope of contemplated objects to which the present teachings may advantageously be applied. Thus, methods and apparatus taught herein may be used for a variety of applications, including multichip modules, PCMCIA cards, printed circuit boards, silicon wafers, security printing, decorative printing, catalysts, electrostatic shielding, hydrogen transport membranes, functionally gradient materials, production of nanomaterials, battery electrodes, fuel cell electrodes, actuators, electrical contacts, capacitors, and so forth. Methods and apparatus taught herein may also be used to produce less intricate surface coatings, or even full surface coatings such as might be employed in preparing reflective coatings for mirrors. Methods and apparatus described are especially useful for preparing full or partial surface coatings on curved surfaces, such as decorations on the sides of a motor vehicle. For such applications, an ink jet type printer with head movement controlled in three dimensions may be used.

Accordingly, the substrate in FIG. 1 is contemplated to represent any suitable substrate, including especially a circuit board, which may or may not be installed in or from part of an electronic device such as a computer, disk drive or other data processing or storage device, a telephone or other communication device, and a battery, capacitor, charger, controller or other energy storage related device.

Suitable energy sources contemplated herein include any source which is capable of effecting the desired chemical reaction(s) without causing excessive damage to the substrate or the coating. Thus, particularly preferred energy sources are radiative and convection heat sources, including especially infrared lamps and hot air blowers. Other suitable energy sources include electron beams, and radiative devices at non-IR wavelengths including x-ray, gamma ray and ultra-violet. Still other suitable energy sources include vibrational sources such as microwave transmitters. It should also be appreciated that the various energy sources can be applied in numerous ways. In preferred embodiments the energy source is directed at the precursor/ligand deposited on the substrate. However, in alternative embodiments, for example, a heated ligand could be applied to a cold precursor, or a heated precursor could be applied to a cold ligand.

Several advantages of various aspects of the present teachings have been observed during experimentation. In one aspect, it has been observed that metal deposits made according to the present teachings, (including, for example, conductive paths of circuit boards), can be made to have a remarkably smooth surface. Among other things, this high degree of smoothness has great utility in depositing pure metals, because such metals are resistant to oxidizing, and therefore tend to maintain high conductivity. From a quantitative viewpoint, preferred embodiments of deposits as described herein can measure less than about roughness (Ra) 0.05 μm, and in particularly preferred embodiments less than about Ra 0.01 μm. Here, the definition of roughness is consistent with that discussed in U.S. Pat. No. 5,632,942 to Yeh et al. (May 1997). Roughness can be measured using a profilometer, e.g., a Sutronic 3P profilometer sold by the Taylor-Hobson Company. The effect of roughness on catalytic substance adhesion is seen by comparing the loss of catalytic substance from undercoated substrates at different surface roughnesses. Generally, a roughness of less than about 0.05 μm is considered to be quite smooth, and tends to be resistant to degradation or surface adhesion. Surface roughness of less than about 0.01 μm is considered to have a polished appearance.

Another advantage of various embodiments of the present teachings is that the coatings can be made to adhere extremely well to substrates, in many instances much better than with other systems. For example, where thin copper lines are deposited on paper or plastic substrates using an ink jet type printer, the substrate can be repeatedly bent at a 90° angle without noticeable cracking or peeling of the lines. (The Scotch tape test).

Yet another advantage of various embodiments of the present teachings is that the coatings can be made to almost any desired thickness. Thus, very thin coatings can be produced to tens of Angstroms or less. This compares very favorably with some previous coating systems in which coatings of less than about several hundred Angstroms are considered difficult to achieve. On the other end of the scale, relatively thick coatings can also be made according to descriptions herein, such as thicknesses of several microns or more in a single pass. Still greater thicknesses can also be made by overlapping coatings, or by layering one coating on top of another. Again this compares favorably with other systems. In U.S. Pat. No. 5,314,825 to Morishita (May 1994), for example, it was stated that thicknesses of greater than several thousand Angstroms of copper, nickel, cobalt or tin were unreachable by the prior art, and that the method in that patent was an improvement because it could deposit such metals in thicknesses of 60 μm.

Still another advantage of various embodiments of the present teachings is that coatings can be deposited using otherwise ordinary printing equipment. Thus, embodiments disclosed herein may utilize an ink jet type dispenser, or a nib, while other embodiments may utilize a stamp or roller. Embodiments may also employ flexographic printing equipment, offset printing devices, silk screening, stamping or micro-stamping, and various spraying equipment. As mentioned above, it is contemplated that any printing process and equipment that uses inks can be employed effectively with embodiments of the present teachings. The ability to utilize such printing equipment not only lowers capital and production costs, but also greatly increases the speed at which deposits can be made on a substrate. The increase in speed is especially apparent when depositing complex patterns, or when depositing a plurality of different substances. In various embodiments of the present teachings, for example, an ink jet type dispenser could dispense different metal compounds as readily as it could dispense different color inks.

Still another advantage of various embodiments of the present teachings is that coatings can be deposited with a purity of at least 80% by weight. In more preferred embodiments the purity of the metal or other material intended to be included in the coating is at least 90%, in still more preferred embodiments the purity is at least 95%, and in most preferred embodiments the purity is at least 97%. Elemental copper, for example, has been shown to be deposited according to the present teachings at a purity of at least 97% by weight, and elemental gold has been shown to be deposited according to the present teachings at a purity of at least 80 by weight.

Still another advantage of various embodiments of the present teachings is that coatings can be deposited with very little waste. In preferred embodiments at least 80% by weight of the material to be deposited on the substrate remains to form the desired pattern. For example, if copper (II) formate is used to produce a copper circuit, then at least 80% of the copper deposited on the substrate remains to form the desired pattern, and no more than 20% of the copper is removed as "waste". In more preferred embodiments the waste is no more than 10%, in still more preferred embodiments the waste is no more than 95%, and in most preferred embodiments the waste is no more than 3%.

Still another advantage of various embodiments of the present teachings is low temperature operation. Metals, for example, can be deposited in desired patterns at temperatures of less than about 150° C., preferably less than about 100° C., more preferably less than about 75° C., and most preferably at ordinary room temperatures of room temperature (25–30° C.). The redox or "curing" step can also be performed at relatively low temperatures below about 100° C., more preferably below about 75° C., and even as low as about 50° C. Even lower temperatures are also possible, although below about 50° C. the redox reaction tends to be too slow for most applications. These ranges allow precursor solutions to be prepared at room temperature, the deposition to be performed at room temperature, and the decomposition to be accomplished using relatively low heat, as from a heat gun, in a room temperature environment. In test embodiments, for example, a copper precursor was deposited on an ordinary piece of paper in an ink jet printer at room temperature, and the precursor was decomposed to provide essentially pure copper using a hair dryer. This and other examples are described below.

EXAMPLE 1

Figure 2:
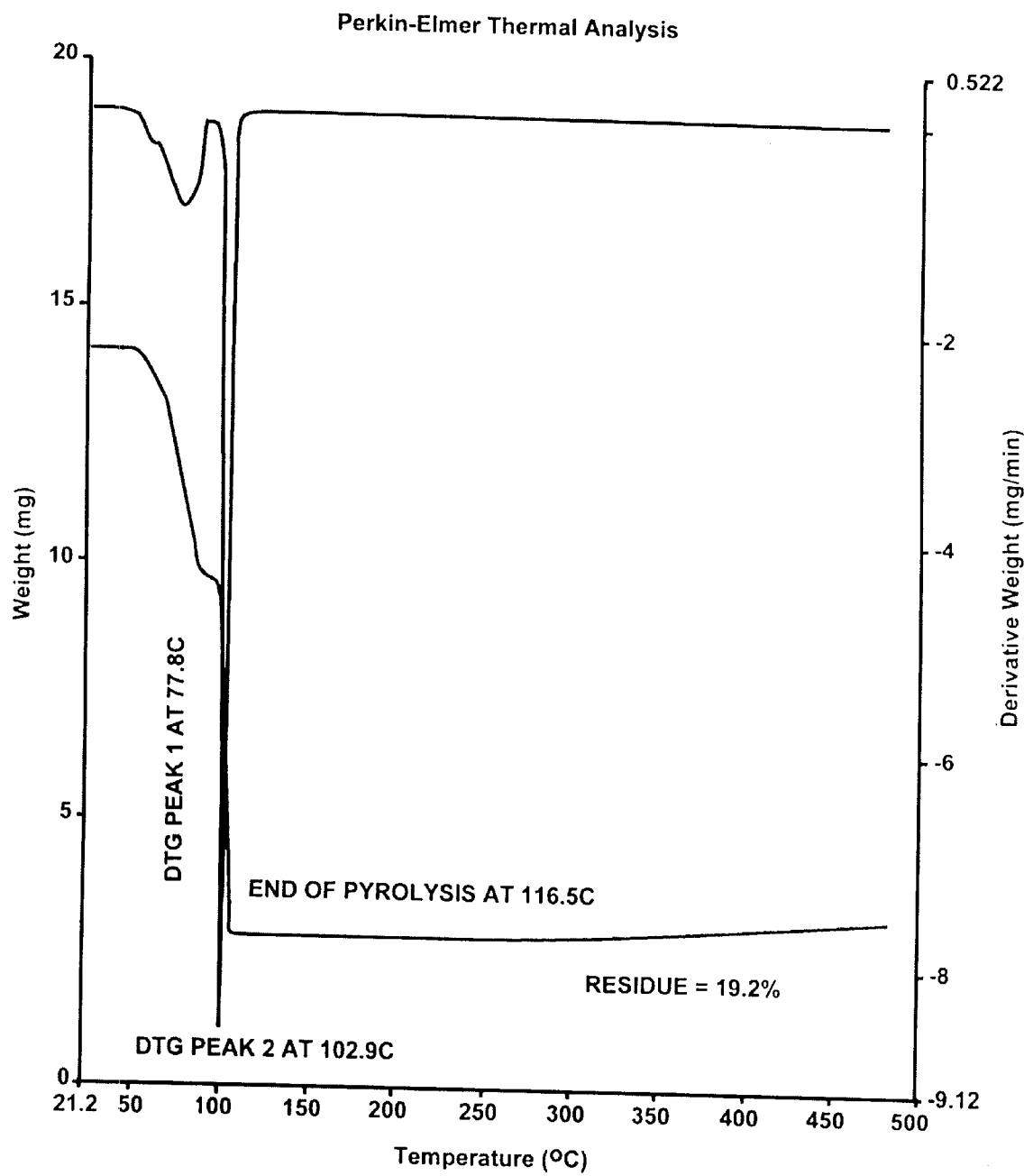
FIG. 2 is a thermogram of a copper oxide coating deposited according to one embodiment of the present teachings.

One particularly preferred embodiment includes a copper (II) formate salt in conjunction with a nitrogen donor molecule. 2.0 gm of copper (II) formate tetrahydrate was taken in a 100 ml round bottom flask and 6.8 gm of cyclohexylamine was added to it. The mixture was stirred at room temperature (25–30° C.) for about 5 to 6 days to obtain a homogeneous viscous mass. Another 0.5 gm of cyclohexylamine was added, and stirring continued for another 24 hours. A thick paste was obtained. The thermogram of this paste gave copper oxide upon heating in air, shown in FIG. 2, and metallic copper upon heating in argon, shown in FIG. 3. The thickness of the solution was reduced by adding an extra about 2 gm of cyclohexylamine. A few drops of this solution were placed in an 8 dram glass vial and heated over a hot air gun. The vial was coated inside with a shining film of copper. 1 gm of this solution was also diluted with 4 gm of cyclohexylamine to obtain a thin copper film. Alternatively, copper (I) may be used advantageously instead of copper (II) to obtain a higher metal loading in the precursor solution. The dissolution of copper (I) formate may be effected by using nitrogen and/or oxygen donors as solvents. Other carboxylates or mixed carboxylates, such as acetate, acrylate, of copper (II) or copper (I) may also be used.

EXAMPLE 2

A piece of Kapton, length 8 cm, breadth 3.5 cm, and thickness 0.005 cm, was placed in a 4 dram glass vial so as to cover the inner wall of the vial. 0.175 gm of copper (II) formate and 1.75 gm of β-picoline were then added to the vial, which was heated on a hot air blower. During heating the in situ generated solution of copper salt was spread on Kapton by tilting and rotating the vial, taking care that the solution does not spill out. Further heating of the vial from all sides except the mouth of the vial, on a hot air blower, drove off the volatiles and produced copper coating on the Kapton.

In this particular example oxygen is excluded from the vial upon addition of the copper (II) formate and β-picoline due to boiling of the solution. In alternative embodiments oxygen may not be automatically excluded from contacting the solution, and in such embodiments it is generally desirable to exclude oxygen in some other manner. Otherwise an oxide or a mixed oxide and elemental metal will likely be deposited on the substrate as opposed to the desired elemental metal. It is also important to note that oxygen need not be excluded at all stages. The exclusion of oxygen is mostly important during precipitation of the metal. Thus, for example, a solution of metal precursor could be loaded into an ink jet type dispenser under an oxygen environment, and deposited under an oxygen environment. However, heating of the precursor on the substrate should generally be carried out in an oxygen free environment.

Thus, novel methods and apparatus for depositing a coating on a substrate have been disclosed. It should be apparent to those skilled in the art, however, that many more modifications besides those already described are possible without departing from the inventive concepts herein. The inventive subject matter, therefore, is not to be restricted except in the spirit of the appended claims.

What is claimed is:

1. A method of depositing a conductive coating in a desired pattern onto a substrate comprising:

depositing a precursor onto the substrate in the desired pattern;

contacting the precursor with a ligand;

applying sufficient energy from an extended radiation source to transfer electrons from the ligand to the precursor, thereby decomposing the precursor to form a conductive precipitate in the desired pattern and thus forming the conductive pattern coating directly on the substrate.

2. The method of claim 1 wherein the coating comprises a metal with a purity of at least about 80%.

3. The method of claim 1 wherein the coating comprises a metal with a thickness of less than about 10 angstroms.

4. The method of claim 1 wherein the coating comprises a metal with a thickness of at least about 100 angstroms.

5. The method of claim 1 wherein the precursor comprises a salt selected from the group consisting of a carboxylate, a halide, a pseudo halide, and a nitrate.

6. The method of claim 1 wherein the precursor comprises a carboxylate.

7. The method of claim 1 wherein the pattern comprises a circuit.

8. The method of claim 1 wherein the ligand comprises a material selected from the group consisting of an amine, an amide, a phosphine, a sulfide, and an ester.

9. The method of claim 1 wherein the ligand is selected from the group consisting of a nitrogen donor, a sulphur, and a phosphorous donor.

10. The method of claim 1 wherein the precipitate comprises a metal.

11. The method of claim 1 wherein the precipitate is selected from the group consisting of copper, zinc, palladium, platinum, silver, gold, cadmium, titanium, cobalt, lead, tin, silicon and germanium.

12. The method of claim 1 wherein the precipitate comprises an electrical conductor.

13. The method of claim 1 wherein the precipitate comprises an electrical semiconductor.

14. The method of claim 1 wherein the substrate comprises a non-conductor.

15. The method of claim 1 wherein the substrate comprises at least one of a conductor and a semiconductor.

16. The method of claim 1 wherein the step of applying energy comprises applying heat.

17. The method of claim 1 wherein the step of applying energy comprises applying infra red radiation.

18. The method of claim 1 wherein the step of applying energy comprises applying vibrational energy.

19. The method of claim 1 wherein the precursor comprises a salt selected from the group consisting of a carboxylate, a halide, a pseudo halide, a nitrate, and the ligand comprises a material selected from the group consisting of an amine, an amide, a phosphine, a sulfide and an ester.

20. The method of claim 16 wherein the precipitate is selected from the group consisting of copper, zinc, palladium, platinum, silver, gold, cadmium, titanium, cobalt, lead, tin, silicon and germanium.

21. The method of claim 16 wherein the step of applying energy comprises applying radiant heat.

22. The method of any one of claims 1–21 wherein the step of depositing the precursor comprises spraying the precursor in the desired pattern.

23. The method of any one of claims 1–21 wherein the step of depositing the precursor is selected from the group consisting of spraying, stamping, roller printing, letter press printing, gravure printing, screen printing, flexographic printing, planographic printing, offset printing, and mimeograph printing.

24. A method of printing a conductive metal in a desired pattern onto a substrate comprising:

drawing a metal precursor and ligand directly onto the substrate according to the desired pattern; and decomposing the precursor by applying energy from an extended radiation source to form the conductive metal in the desired pattern, without removing from the substrate a substantial quantity of the precursor, and without removing from the substrate a substantial quantity of the metal.

25. The method of claim 24 wherein the metal pattern comprises a substantially pure metal, with impurities less than about 20% by weight.

26. The method of claim 24 wherein the step of decomposing comprises thermally decomposing.

27. The method of claim 24 wherein the step of decomposing comprises thermally decomposing at a temperature of less than about 300° C.

28. The method of claim 24 wherein the metal is selected from the group consisting of an elemental metal, an alloy, a metal/metal composite, a metal ceramic composite, and a metal polymer composite.

* * * * *